(12) United States Patent
Bach et al.

(10) Patent No.: US 9,748,969 B1
(45) Date of Patent: Aug. 29, 2017

(54) METHOD OF OPERATION FOR AN OVERSAMPLED DATA CONVERTER

(71) Applicant: Infineon Technologies AG, Neubiberg (DE)

(72) Inventors: Elmar Bach, Villach (AT); Patrizia Greco, Villach (AT); Wiesbauer Andreas, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/098,988

(22) Filed: Apr. 14, 2016

(51) Int. Cl.
H03M 3/00 (2006.01)

(52) U.S. Cl.
CPC .............. *H03M 3/38* (2013.01); *H03M 3/378* (2013.01); *H03M 3/496* (2013.01)

(58) Field of Classification Search
CPC ........ H03M 3/458; H03M 1/12; H03M 3/358; H03M 3/38; H03M 1/0854; H03M 7/3004; H03M 1/00
USPC .................................. 341/118–121, 143, 172
See application file for complete search history.

(56) References Cited

U.S. PATENT DOCUMENTS

| | | | | |
|---|---|---|---|---|
| 5,745,060 A * | 4/1998 | McCartney | .............. | H03M 3/38 341/120 |
| 6,040,793 A * | 3/2000 | Ferguson, Jr. | .......... | H03M 3/44 327/337 |
| 6,191,715 B1 * | 2/2001 | Fowers | ................. | H03M 3/388 341/120 |
| 6,509,852 B1 * | 1/2003 | Todsen | .................. | H03M 3/382 341/118 |
| 6,744,394 B2 * | 6/2004 | Liu | .......................... | H03M 3/34 341/144 |
| 7,102,558 B2 * | 9/2006 | Deval | ................... | H03M 3/434 341/143 |
| 7,551,109 B1 * | 6/2009 | Ashmore, Jr. | ........ | H03M 3/382 341/118 |
| 8,791,846 B2 * | 7/2014 | Cho | ........................ | H03M 3/38 341/118 |

(Continued)

OTHER PUBLICATIONS

Kasmiri, S.M., et al., "A Thermal-Diffusivity-Based Frequency Reference in Standard CMOS With an Absolute Inaccuracy of +/× 0.1% From -55° C. to 125° C.", IEEE Journal of Solid-Sate Circuits, vol. 45, No. 12, Dec. 2010, pp. 2510-2520.

(Continued)

*Primary Examiner* — Linh Nguyen
(74) *Attorney, Agent, or Firm* — Slater Matsil, LLP

(57) ABSTRACT

In accordance with an embodiment, a method of operating an oversampled data converter having a switched-capacitor (SC) integrator includes operating the oversampled data converter in a gain calibration mode; applying a first voltage to a feedback port of the SC integrator to form a feedback voltage, and during a first clock phase the method further includes applying the first voltage to a first series capacitor via the input port when an output of the oversampled data converter is in a first state; applying a bypass voltage to the first series capacitor when the output of the oversampled data converter is an a second state and applying the first voltage to a second series capacitor via the feedback port with a polarity based on the output of the oversampled data converter, and during a second clock phase the method includes integrating charges of the first series capacitor and the second series capacitor.

26 Claims, 12 Drawing Sheets

(56) References Cited

U.S. PATENT DOCUMENTS

| | | | |
|---|---|---|---|
| 2008/0238743 A1* | 10/2008 | Koyama ............... | H03M 3/328 |
| | | | 341/131 |
| 2010/0103014 A1* | 4/2010 | Quiquempoix ......... | H03M 3/34 |
| | | | 341/143 |
| 2013/0099955 A1* | 4/2013 | Shaeffer .............. | H03M 7/3015 |
| | | | 341/200 |

OTHER PUBLICATIONS

Pertijs, M.A.P. et al., "Precision Temperature Sensors in CMOS technology" Dordrecht, The Netherlands, Springer, 2006, pp. 51-54 and 108-112, 182-183, 194-196, 258-259.

* cited by examiner

METHOD OF OPERATION FOR AN OVERSAMPLED DATA CONVERTER

TECHNICAL FIELD

The present invention relates generally to a delta-sigma analog to digital converter (ADC) and method of controlling the same, and, in particular embodiments, to a method of operation for an oversampled data converter.

BACKGROUND

Analog to digital converters are commonly used in many electronic applications in order to convert analog signals to digital signals. In real world, most data or signals are characterized by analog signals, for example, temperature, voice, light, pressure, and so forth. These analog signals, which are continuous in time and amplitude, are converted to digital signals that are discrete with respect to time and quantized with respect to amplitude by an ADC. The ADC architectures vary based on the end applications, cost, speed and resolution. Various types of ADCs include, for example, Flash ADC, Delta-sigma ADC, Successive approximation type ADC and dual slope ADC.

Modern temperature sensors use high performance ADCs to accurately convert an analog measurement of temperature into digital data that may be used for further processing. When designing a high performance ADC, various attributes that may be taken into account include, for example, resolution, speed, silicon area, noise, and frequency of operation. Various errors may be introduced during an analog to digital conversion of a temperature signal. The errors may include, for example, gain error of the ADC, noise coupling, and mismatch between various components inside the ADC. Calibration of the ADC is one of various ways to minimize such errors.

SUMMARY

In accordance with an embodiment, a method of operating an oversampled data converter having a switched-capacitor (SC) integrator includes operating the oversampled data converter in a gain calibration mode; applying a first voltage to a feedback port of the SC integrator to form a feedback voltage, and during a first clock phase the method further includes applying the first voltage to a first series capacitor via the input port when an output of the oversampled data converter is in a first state; applying a bypass voltage to the first series capacitor when the output of the oversampled data converter is an a second state and applying the first voltage to a second series capacitor via the feedback port with a polarity based on the output of the oversampled data converter, and during a second clock phase the method includes integrating charges of the first series capacitor and the second series capacitor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
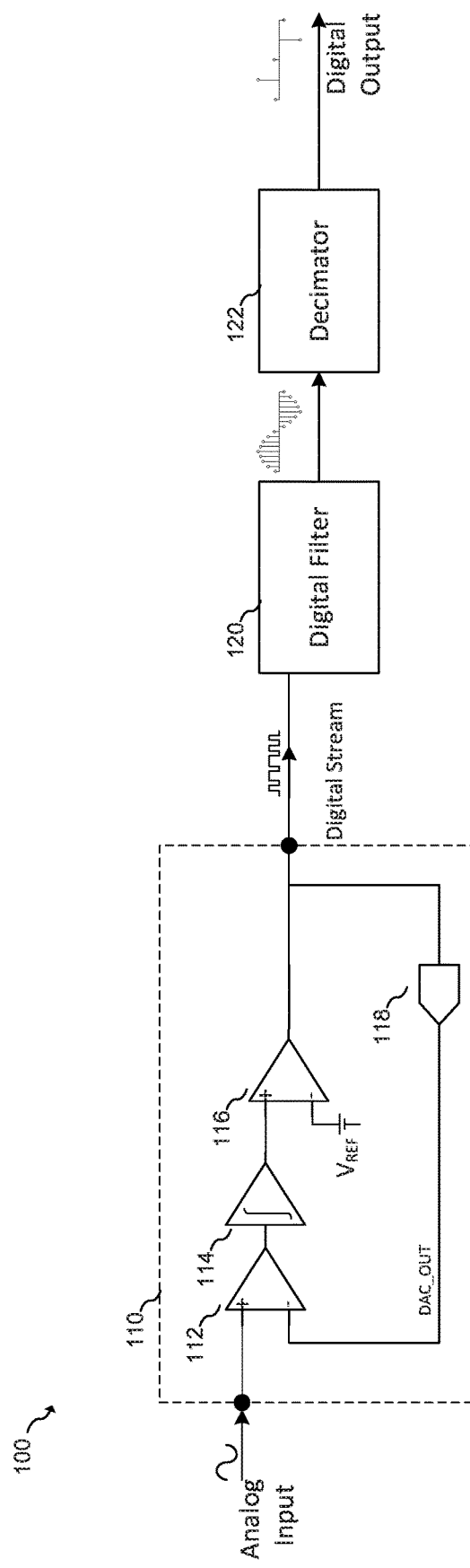
FIG. 1 illustrates an exemplary delta-sigma analog-to-digital converter ADC.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for measuring and calibrating gain of an analog to digital converter (ADC) that uses charge balancing scheme in an input stage of a delta-sigma modulator. Embodiments of the present invention may also be applied to various systems that utilize switched capacitor amplifiers.

Various analog physical phenomena can be converted to electrical signals. These physical phenomena, for example, temperature, sound, and pressure, are translated to information in electrical domain by various sensors. The electrical signal may be converted into the digital domain for further signal processing. The processing can be performed via a micro-processor or a micro-controller in a digital domain. Such conversion of an analog signal to the digital output is performed by an ADC that may have inherent errors due to noise, and other design variations. A delta-sigma ADC is one of various types of ADCs that are used for applications involving precision industrial measurement.

A delta-sigma modulator is widely used for delta-sigma ADC converters. Precision measurement of static values such as temperature, pressure and other analog signals are often performed by the delta-sigma ADC converters. Knowledge of the actual gain of the delta-sigma ADC prior to a conversion enables accurate or error free measurements of various input analog signals described above. One way of determining the actual gain in a delta-sigma ADC is to perform a gain measurement and/or calibration. Once the gain of the delta-sigma ADC is known, the analog input value to the ADC can be accurately derived based on knowledge of the delta-sigma ADC gain.

Generally, the measurement of an ADC gain involves introducing a known analog input signal having a known DC value. In many ADC architectures, a known reference voltage is also used. (ADC output values are often a code that represents a ratio of the input signal to the reference voltage.) In some conventional circuits, such a measurement may be performed with multiple precision reference voltages and multiple conversions.

In embodiments of the present invention, the gain of a sigma-delta modulator is measured using a single conversion and a single input voltage that is applied to both the input port and the reference/feedback voltage port of the sigma-delta modulator. By performing a single conversion with a single input voltage, it is possible to quickly and accurately determine the actual gain of the ADC using an internal voltage reference without knowing the reference itself.

During an embodiment gain measurement, the first integration stage of the sigma-delta modulator samples the input voltage at the input port if a feedback value of the sigma-delta modulator is in a first state, and bypasses the input port if the feedback value is in a second state. A bit stream is produced by the sigma-delta modulator when it operates in this manner, and an output value VADCOUT is generated from the bit stream by filtering. Next, a gain value is derived from VADCOUT as follows:

$$K_{ADCreal} = 2 \cdot \frac{V_{ADCOUT}}{1 - V_{ADCOUT}}. \quad (1)$$

This derived value of the real ADC gain may be used during the post processing of measurements made by the ADC during normal operating condition. In some embodiments, the ADC may be used to process the electrical output of a temperature sensor.

FIG. 1 illustrates an exemplary delta-sigma ADC 100 that includes a first order delta-sigma modulator 110 in series with a digital filter 120 and a decimator 122. First order delta-sigma modulator 110 samples an analog input signal and converts the analog input signal to a quantized output by comparing the input to a reference voltage. The quantized output is a stream of digital values that represent the value of the analog input signal. The quantized output is fed back to a 1-bit feedback DAC 118. Delta-sigma modulator 110 uses the output of 1-bit feedback DAC 118 and compares it with the analog input signal. The difference between the analog input signal and the output of the 1-bit feedback DAC is generated by a difference amplifier 112 and an output of difference amplifier 112 is integrated by an integrator 114. The output of the integrator 114 is provided to a 1-bit ADC 116. The 1-bit ADC 116 converts the integrator output to a digital output of one or zero, which is fed to the 1-bit feedback DAC 118. Other delta-sigma modulators can be of a higher order, for example, second, third, fourth and fifth.

The stream of digital values representing the analog input signal at the output of the delta-sigma modulator 110 is fed to the digital filter 120. Digital filter 120 is commonly implemented by a low pass averaging filter. In other applications, different types of low pass filters may be used. A decimator 122 is connected at the output of the digital filter 120. Decimator 122 filters the digital signal's output rate by down sampling the output data in order to reduce the digital signal's sample rate.

Generally, the gain of delta-sigma modulator 110 is based on the magnitude of the DAC output. For example, when the analog input signal equals to full-scale DAC output, the bit stream will represent a full-scale value (e.g., most or all of the pulses in the bit stream will be high). It should be understood, however, that many delta-sigma modulators are operated below full scale for stability reasons.

In a delta-sigma modulator that utilizes a switched-capacitor structure, the magnitude of the DAC output is scaled by input capacitors of a first stage switched-capacitor integrator. Consequently, the gain of the delta-sigma modulator is based on a ratio of DAC input capacitor and an input signal input capacitors. This gain value may be affected by parasitic capacitances and device mismatches.

Figure 2A:
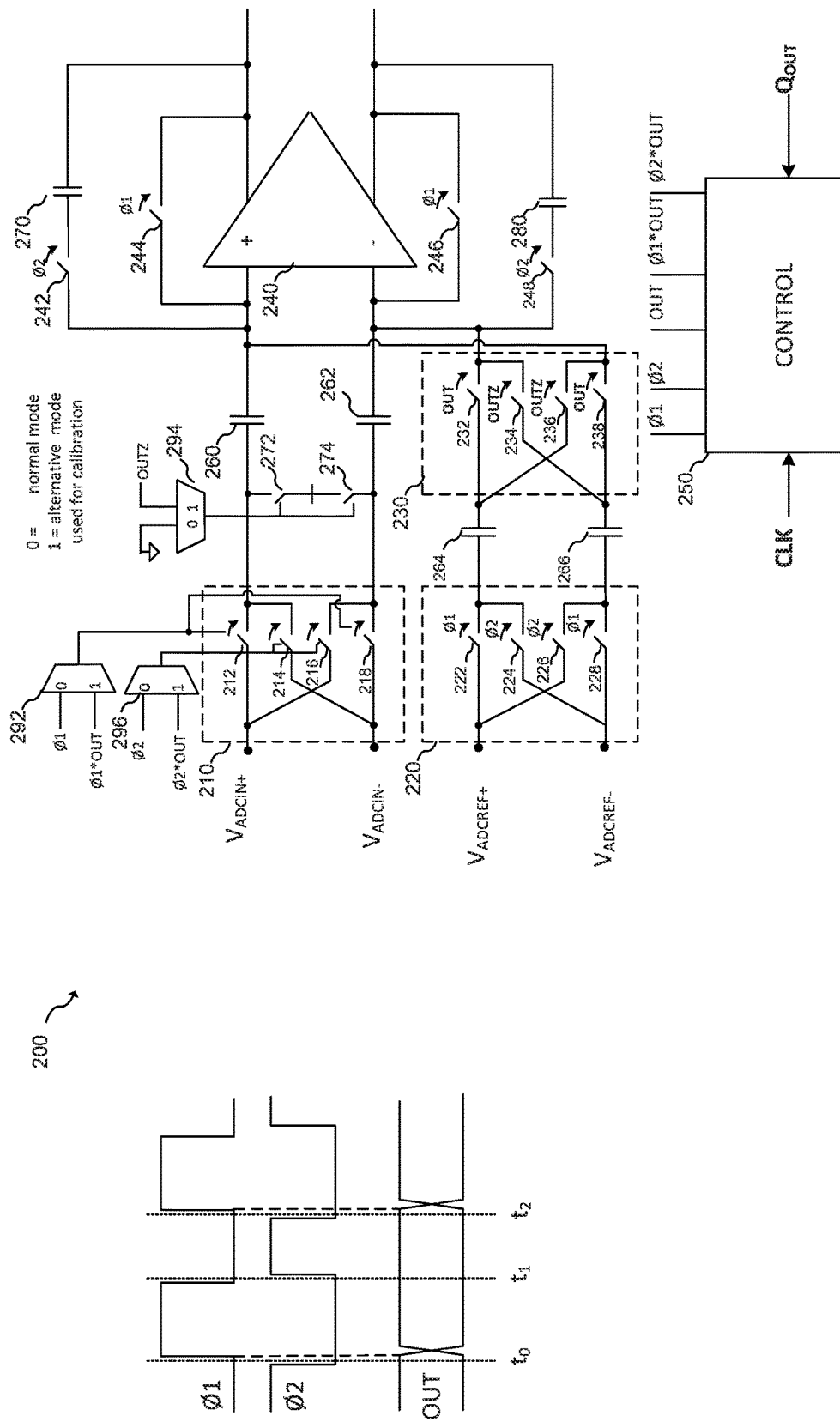
FIG. 2A illustrates a fully differential switched-capacitor integrator of a delta-sigma modulator configured to use an embodiment gain calibration method by using a multiplexer.

FIG. 2A illustrates an embodiment switched-capacitor (SC) integrator 200 used in a delta-sigma ADC modulator. In an embodiment, operating SC integrator 200 includes using different switching schemes during a gain calibration mode and during a normal operation mode. However, in some embodiments, the gain calibration switching scheme may be used to perform conversions during the normal operation mode. SC integrator 200 provides the option of the normal operation mode and the calibration mode by using a MUX 292, a MUX 294 and a MUX 296. MUX 292, MUX 294 and MUX 296 multiplex control signals of switches 212, 218, 214, 216, 272 and 274 based on the mode of operation. During the normal mode of operation, switches 212 and 218 are controlled by clock phase signal ø1, and switches 214 and 216 are controlled by phase signal ø2. During the normal mode, switches 272 and 274 remain open.

The operation of the switched capacitor integrator 200 is divided into two clock phases. During a first clock phase ø1, the integrating capacitors 270 and 280 are removed from the feedback path and an integrating amplifier 240 is auto-zeroed by closing switches 244 and 246. In various embodiments, the amplifier offset is stored when integrating amplifier 240 is auto-zeroed and subtracted during integration Integrating amplifier 240 operates in a fully differential mode by using differential inputs and differential outputs. Sampling of differential input voltage and differential reference voltage are performed during the first clock phase ø1 based on a quantizer output $Q_{OUT}$. Input offset of integrating amplifier 240 is stored across sampling capacitors 260 and 262 during clock phase ø1.

In the normal mode of operation, input sampling capacitor 260 samples differential input $V_{ADCIN+}$ via switch 212 at a first terminal. Similarly, input sampling capacitor 262 samples $V_{ADCIN-}$ via switch 218 at a first terminal. When quantizer output $Q_{OUT}$ is at a first output level (i.e., high), a capacitor 264 samples differential reference voltage $V_{ADCREF+}$ and a capacitor 266 samples VADCREF−. It is to be noted that during the normal operation, excluding of input differential voltage $V_{ADCIN}$ does not occur in some embodiments. Similarly, switches 212, 214, 216 and 218 are controlled by signals ø1 and ø2 and not by the gated signals ø1*OUT and ø2*OUT in the embodiment shown in FIG. 2A. The differential reference voltages $V_{ADCREF+}$ and $V_{ADCREF-}$, which are sampled over capacitors 264 and 266, are switched during when the quantizer output is at a second output level (e.g. low).

During a second clock phase ø2 of normal mode operation, the sampling capacitor 260 samples input differential voltage $V_{ADCIN-}$ and sampling capacitor 262 samples input differential voltage $V_{ADCIN+}$ at their first terminals. Similarly, $V_{ADCREF-}$ is sampled by capacitor 264 and $V_{ADCREF+}$ is sampled by capacitor 266. The second clock phase ø2 is an integration phase where switches 242 and 248 are closed to connect differential outputs of the amplifier 240 via integrating capacitors 270 and 280 to the differential inputs of the amplifier 240. The charge stored across the input sampling capacitors 260 and 262 and capacitors 264 and 266 are integrated during the second clock phase ø2.

FIG. 2A further includes a first bank of switches 210 that includes switches 212, 214, 216 and 218 to connect differential inputs VADCIN+ and VADCIN− to input sampling capacitors 260 and 262. A second bank of switches 220 includes switches 222, 224, 226 and 228 to connect differential reference inputs VADCREF+ and VADCREF− to reference sampling capacitors 264 and 266. A third bank of switches 230 includes four switches 232, 234, 236, and 238 to swap connections of reference sampling capacitors 264 and 266 to non-inverting and inverting inputs of amplifier 240.

Referring to FIG. 2A, fully differential switched-capacitor integrator circuit 200 is controlled by a control circuit 250 that generates two non-overlapping clock signals ø1 and ø2. These two non-overlapping clock signals ø1 and ø2 control various switches used at the differential inputs of the switched-capacitor integrator circuit 200. Control circuit 250 also generates logic signals OUT and OUTZ depending on the quantizer result and two logically gated signals of clock phase ø1 and ø2 with the quantizer (not shown) output $Q_{OUT}$. Logic signals OUT and OUTZ control switches 230, and control switches 272 and 274 via MUX 294. The logically gated signals are denoted by ø1*OUT and ø2*OUT. The logic signal OUTZ is an inverted signal of OUT. It is understood that during the clock phase ø1, the switches associated with ø1 are closed and during the clock phase ø2, the switches associated with ø2 are closed. Similarly, switches associated ø1*OUT are closed when both ø1 and quantizer output $Q_{OUT}$ is high. A timing sequence of non-overlapping clock signals ø1 and ø2 and OUT is shown in FIG. 2A. Vertical dotted lines at time t0, t1, and t2 are drawn to show non-overlapping nature of the clocks ø1 and ø2.

In an embodiment, the differential ADC input voltage $V_{ADCIN}$ is scaled by a gain factor known as $K_{ADC}$ and level shifted by the reference voltage $V_{ADCREF}$. The ADC input voltage $V_{ADCIN}$ is integrated by integrating capacitors 270 and 280. The output voltage of the ADC is given by the equation:

$$V_{ADCOUT} = K_{ADC} \frac{V_{ADCIN}}{V_{ADCREF}}, \quad (2)$$

where $K_{ADC}$ is a ratio of sampling capacitor 260, used for ADC input voltage, and reference sampling capacitor 264, used for ADC reference voltage. Thus, $K_{ADC}$, which is also known as ADC gain can be expressed as:

$$K_{ADC} = \frac{C_{260}}{C_{264}}. \quad (3)$$

Various factors can contribute to the errors in the ADC gain $K_{ADC}$, for example, a mismatch between sampling capacitors 260 and 264, mismatch between various components in the differential paths of fully differential amplifier 240. However, smaller capacitors are affected largely by the parasitic capacitances across the switches and parasitic capacitances across the sampling capacitors. Furthermore, inaccuracies in generating ADC reference voltage may also affect the gain and as well as the measurement of the ADC output voltage $V_{ADCOUT}$. A pre-measurement of ADC gain during a calibration mode may allow using smaller value capacitors for designing a differential switched-capacitor integrator. The smaller value of the sampling capacitor may allow faster speed and smaller area. In an embodiment, the values of sampling capacitors 260 and 262 are chosen to be 5 fF. Alternatively, other values may be used.

In an embodiment gain calibration method, an actual ADC gain is calculated by performing a single measurement of an ADC output in a particular condition, where an ADC reference voltage $V_{ADCREF}$ is used as an ADC input voltage $V_{ADCIN}$. Based on the equation (1), this particular condition of providing the $V_{ADCREF}$ as $V_{ADCIN}$ makes the $V_{ADCOUT}$ to be equal to ADC gain $K_{ADC}$. By measuring the $V_{ADCOUT}$, the ADC gain $K_{ADC}$ can be calculated. If ADC input $V_{ADCIN}$ is larger than ADC full scale, then an accurate measurement of ADC gain $K_{ADC}$ may not be feasible. The ADC full scale voltage is given by the equation:

$$V_{ADC\ FULLSCALE} = \frac{V_{ADCREF}}{K_{ADC}}. \quad (4)$$

Figure 2B:
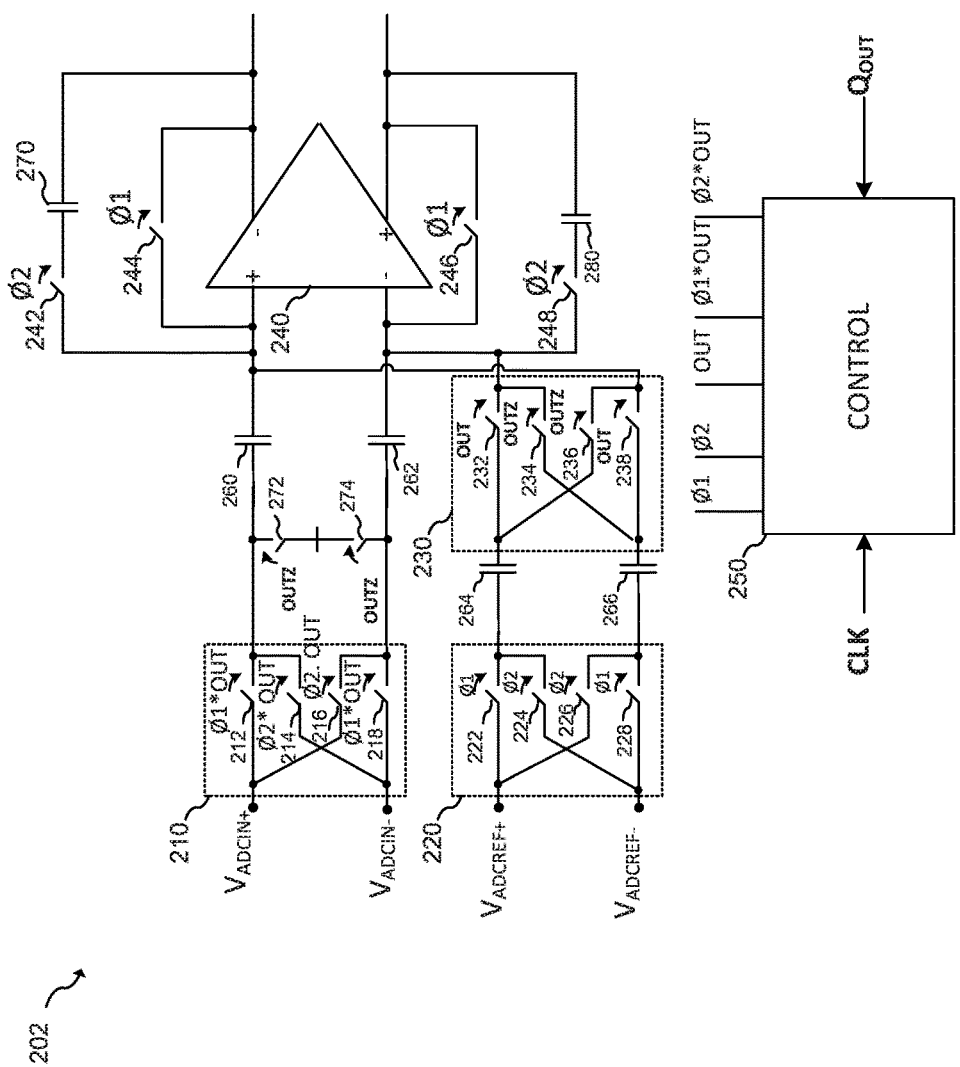
FIG. 2B illustrates a fully differential switched-capacitor integrator of a delta-sigma modulator configured to use an embodiment gain calibration method.
Figure 2B:
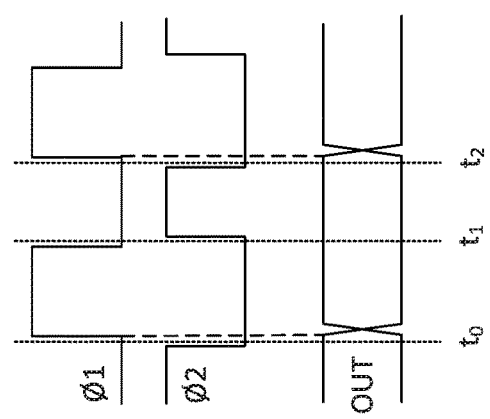

In such a condition, ADC gain $K_{ADC}$ is measured by applying an ADC input voltage $V_{ADCIN}$ that is equal to the ADC reference voltage $V_{ADCREF}$. FIG. 2B illustrates an embodiment switched-capacitor (SC) integrator 202 that facilitates an embodiment calibration mode. The embodiment SC integrator 202 represents the SC integrator shown in FIG. 2A when mux 292, 294 and 296 are configured to the gain calibration mode. Fully differential switched-capacitor integrator 202 includes switches 272 and 274 which are used when the output $Q_{OUT}$ of the quantizer is at low level or a second output level, to connect first terminals of sampling capacitors 260 and 262. According to an embodiment, samples of the ADC input signal are taken at time intervals based on a sampling rate via first bank of switches 210. The sampling may be performed in two steps. The first step covers a time period when the quantizer output $Q_{OUT}$ is high. During the first step, ADC input voltage VADCIN is sampled across sampling capacitors 260 and 262. Similarly, ADC reference voltage VADCREF is sampled across reference sampling capacitors 264 and 266. During phase ø2, the inverted input ($-V_{ADCIN}$) is sampled by sampling capacitors 260 and 262. Similarly, during phase ø2, the inverted reference ($-V_{ADCREF}$) is sampled across reference sampling capacitors 264 and 266. The second step of clock phase ø1 includes a time period when quantizer output $Q_{OUT}$ is low or at a second output level. During the second step, reference sampling capacitor 264 is connected to a non-inverting input node of amplifier 240 and reference sampling capacitor 266 is connected to an inverting input node of amplifier 240.

During normal operation of the switched-capacitor integrator 200, a voltage equation at the non-inverting input summing node of amplifier 240 can be derived. Two equations are obtained based on a first or high level output $Q_{OUT}$ of the quantizer output during a clock phase ø2. The equations can be expressed as:

$K_{ADC}*V_{ADCIN}+V_{ADCREF}$ if OUT="High" or "1" or (OUTZ="Low" or "0")

$K_{ADC}*V_{ADCIN}-V_{ADCREF}$ if OUT="Low" or "0" or (OUTZ="High" or "1")

where $K_{ADC}$ is the ADC gain and proportional to a ratio of an input sampling capacitor and a reference sampling capacitor.

During gain calibration, the switched capacitor integrator may use a new ADC reference voltage $V'_{ADCREF}$. The new ADC reference voltage can be expressed as:

$$V'_{ADCREF} = K_{ADC} * V_{ADCIN} + V_{ADCREF}. \quad (5)$$

Using the new ADC reference voltage, $V'_{ADCREF}$ in ADC output voltage $V_{ADCOUT}$ in equation (1) can be rewritten as:

$$V_{ADCOUT} = K_{ADC} * \frac{V_{ADCIN}}{V'_{ADCREF}} = K_{ADC} * \frac{V_{ADCIN}}{K_{ADC} * V_{ADCIN} + V_{ADCREF}}. \quad (6)$$

In an embodiment, the switching sequence during gain calibration is configured based on a high or a first output level of quantizer output $Q_{OUT}$ and clock phase ø1. As such, the equations representing the summing voltage at an input of the integrating amplifier 240 of the switched-capacitor delta-sigma modulator 300 are derived. The equations can be expressed as:

$$K_{ADC} * V_{ADCIN} + K_{ADC} * V_{ADCIN} + V_{ADCREF} = 2K_{ADC} * V_{ADCIN} + V_{ADCREF} \quad (7)$$

if OUT="High" or "1" or (OUTZ="Low" or "0") and $$K_{ADC} * V_{ADCIN} - (K_{ADC} * V_{ADCIN} + V_{ADCREF}) = -V_{ADCREF} \quad (8)$$

if OUT="Low" or "0" or (OUTZ="High" or "1").
Using the relationship between the ADC output $V_{ADCOUT}$ and the ADC gain $K_{ADC}$ described in equation (6) and selecting $V_{ADCREF} = V_{ADCIN}$ we get, $$V_{ADCOUT} = \frac{\frac{K_{ADC}}{2}}{\frac{K_{ADC}}{2} + 1}. \quad (9)$$

In various embodiments, the ADC gain $K_{ADC}$ can be calculated to obtain a real ADC gain $K_{ADCreal}$ that is a function of an ADC output voltage $V_{ADCOUT}$ and not dependent on the reference voltage $V_{ADCREF}$ that is being applied during the measurement. The real ADC gain $K_{ADCreal}$ can be calculated by rearranging equation (9) and can be expressed as:

$$K_{ADCreal} = 2 \cdot \frac{V_{ADCOUT}}{1 - V_{ADCOUT}}. \quad (10)$$

In the present embodiment, the real ADC gain $K_{ADCreal}$ measurement is performed by setting an ADC input $V_{ADCIN}$ equal to ADC reference voltage $V_{ADCREF}$. In another embodiment, the ADC gain $K_{ADC}$ can be a value different than unity and the output of the ADC is not saturated during the calibration mode as shown by the equation (9). According to an embodiment, where an ADC gain $K_{ADC}$ is selected to be less than a value of 50, the ADC output $V_{ADCOUT}$ cannot cause a saturation of the ADC.

The real ADC gain $K_{ADCreal}$ can be calculated by a single or multiple measurements of ADC output $V_{ADCOUT}$ during a calibration mode and the calculated value $K_{ADCreal}$ can be used during normal operation to eliminate errors due to mismatches and parasitic capacitors of nominally identical devices, for example, sampling capacitors, sampling switches in the delta-sigma modulator. In an embodiment, real ADC gain $K_{ADCreal}$ may be calculated by using ADC reference voltage $V_{ADCREF}$ as an ADC input $V_{ADCIN}$ and the value of real ADC gain. The value of $K_{ADCreal}$ may be stored in digital storage, for example, random access memory of an ASIC, for further post-processing.

As illustrated in FIGS. 2A and 2B the SC integrator has differential structure. Such a differential structure utilizes a sample capacitor in each differential input path of the amplifier. Similarly, a reference sampling capacitor is used in each differential input of the reference voltage. The effects of charge injections from the power supply via the switches connected in series with the sampling capacitors can be reduced by using a fully differential switched-capacitor amplifier. The symmetry of the differential input paths allows the charge injections to be common mode signals. Therefore, clock feed through, charge injection by switches and power supply rejection can be greatly improved. Furthermore, using a fully differential structure allows for increased common mode rejection.

Figure 3:
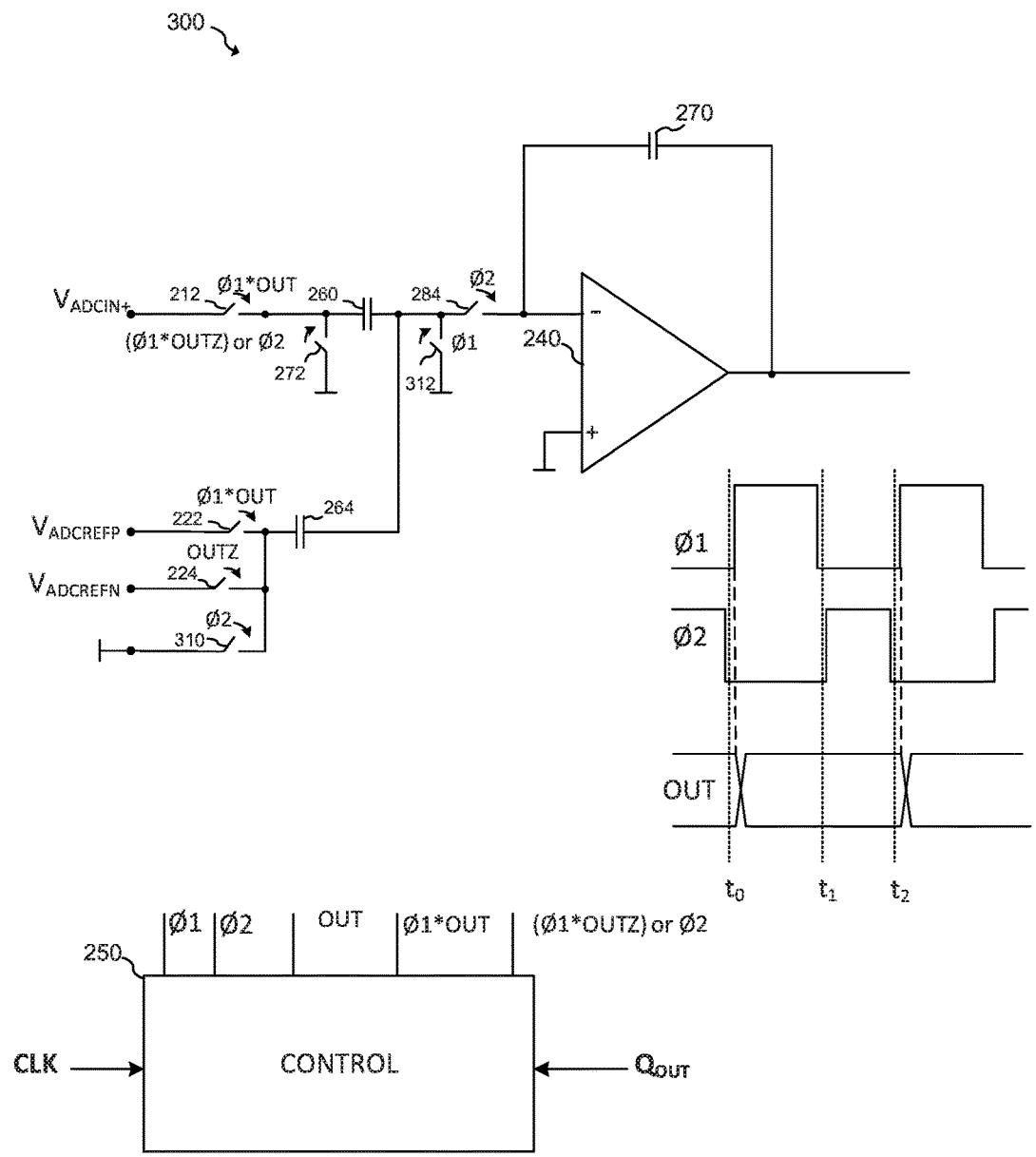
FIG. 3 illustrates an embodiment single ended switched-capacitor integrator of a delta-sigma modulator configured to use an embodiment gain calibration method.

FIG. 3 illustrates an embodiment single ended switched-capacitor integrator 300 of a delta-sigma modulator that is configured to implement an embodiment gain calibration mode. The single ended switched-capacitor integrator 206 receives a single ended ADC input $V_{ADCIN}$ and two reference input voltages $V_{ADCREFP}$ and $V_{ADCREFN}$. The difference between the reference voltages $V_{ADCREFP}$ and $V_{ADCREFN}$ sets an ADC reference voltage $V_{ADCREF}$. The calibration mode is divided in two phases: a first clock phase ø1 and a second clock phase ø2. The first clock phase ø1 includes the period when clock ø1 is high and ø2 is low. Alternatively, the second clock phase ø2 includes the period when ø2 is high and ø1 is low. The first clock phase ø1 can be termed as a sampling phase and the second clock phase ø2 as an integration phase.

The first clock phase ø1 is also divided into two steps: a first step and a second step based on an output of the quantizer $Q_{OUT}$. The first step includes the period when the quantizer output $Q_{OUT}$ is at a first output level. During the first step, sampling capacitor 260 is charged to an input voltage $V_{ADCIN}$ by having a switch 212 closed. The first step of the first clock phase ø1 also includes sampling of a first reference voltage $V_{ADCREFP}$ by sampling capacitor 264 via the closure of switch 222. The non-sampling terminals of the sampling capacitors 260 and 264 are coupled to a dc bias voltage (i.e., a ground voltage) during the first clock phase ø1. In various embodiments, the dc bias voltage can be a ground voltage or any other voltage based on the design specification.

The second step of the first clock phase ø1 includes charging reference sampling capacitor 264 a second reference voltage $V_{ADCREFN}$ by closing switch 224 and by doing so, the reference sampling capacitor is charged to the ADC reference voltage that is equal to a difference of $V_{ADCREFP}$ and $V_{ADCREFN}$. Sampling capacitor 260 is bypassed from ADC input voltage $V_{ADCIN}$ by having switch 212 open. A switch 272 connects the sampling terminal of sampling capacitor 260 to the dc bias during the second step. An integrating switch 284 remains open during the sampling phase and does not allow any integration during first clock phase ø1.

During the integration phase a first terminal of the sampling capacitor 260 is connected to a dc bias voltage (e.g., ground voltage) by the switch 272. At the same time, a first terminal of the reference sampling capacitor 264 is connected to the dc bias voltage (i.e., ground voltage) via a switch 310. The charges stored across the sampling capacitor 260 and the reference sampling capacitor 264 are integrated by the sampling capacitor 270 by having integrating switch 284 closed. In the present embodiment, the integration is performed by an amplifier 240.

Figure 4:
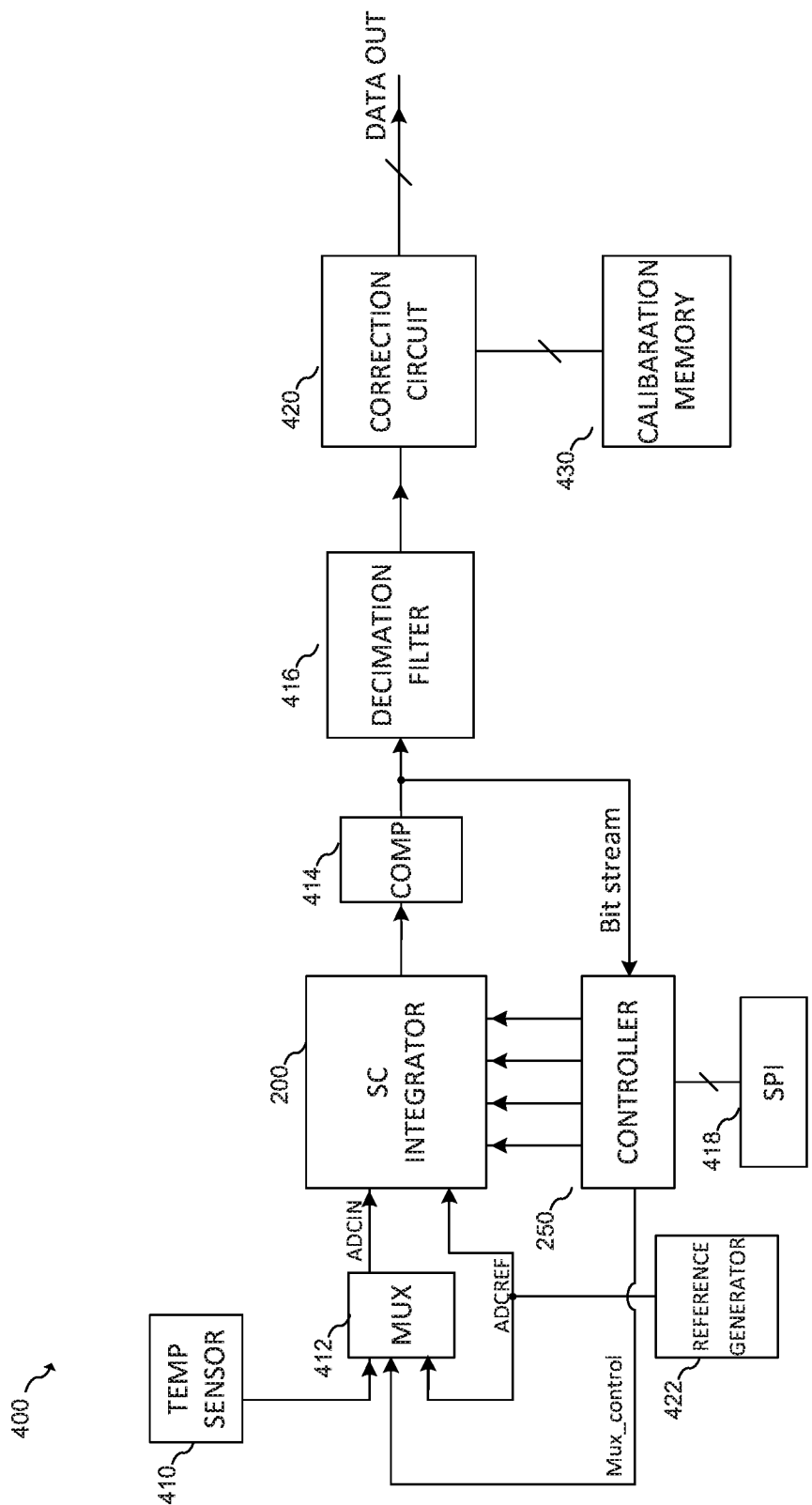
FIG. 4 illustrates an embodiment delta-sigma ADC with a temperature sensor and a correction circuit to correct an output data value using a calibration coefficient.

FIG. 4 illustrates a block diagram of an embodiment sigma-delta ADC 400 that includes a temperature sensor 410 and a SC integrator 200 having an analog signal input and a reference signal input. An output of a mux 412 is used to select between an output of temperature sensor 410 and a reference signal ADCREF generated by a reference generator 422. According to various operating modes, for example, during a normal operation mode, the mux 412 selects the output of a temperature sensor 410. Alternatively, during a calibration mode the mux 412 selects the reference signal ADCREF. In other embodiments, the output of the mux 412 may be connected to the reference signal input of SC integrator 200, such that during the calibration mode, mux 412 selects the temperature sensor output as the reference signal going to SC integrator 200. In another embodiment, an external ADC reference voltage may be applied during a calibration mode that includes a post-processing of the output of the correction circuit 420. A controller 250 provides a mux control signal mux_control to control the mux 412 in addition to various non-overlapping clock phase signals to SC integrator 200 based on a bit stream output of a comparator 414 connected to the output of the SC integrator 200. The digital bit stream output of comparator 414 represents the value of the analog input signal to the SC integrator 200. A serial port interface (SPI) block 418 may be used to allow further communication and programmability with the controller 250 via serial port bits and a clock signal.

A decimation filter 416 is coupled at the output of the comparator 414 to filter out the output rate of the bit stream by down sampling. The output of the decimation filter 416 represents a digital code that represents the analog signal provided at the input of the SC integrator 200. The digital code is further processed through a correction circuit 420 where the digital code is adjusted by using a calibration coefficient. The calibration coefficient is a value that is used to correct the digital code coming out of the decimation filter in order to eliminate any errors due to mismatch, and other parasitic effects in the device. The calibration coefficient is calculated using the calibration mode and the calculated value may be stored in a memory circuit 430. The memory circuit 430 may be used to retrieve the calibration coefficient via a bi-directional interface between the memory circuit 430 and the correction circuit 420.

In some embodiments, the correction circuit 420 and the memory 430 can be implemented in one single block. During operation, the correction circuit may apply the calibration coefficient stored in the memory to output the value of the ADC. The output value may be related to a PTAT number, typically named μ. A digital temperature reading $D_{OUT}$ may be obtained by linear scaling of PTAT number μ, which is expressed as:

$$Dout = A*\mu + B. \quad (11)$$

In an embodiment, coefficient A is calculated using the results of some calibration steps that include the measurement of the ADC real gain. The other coefficient B is the Kelvin temperature.

Figure 5:
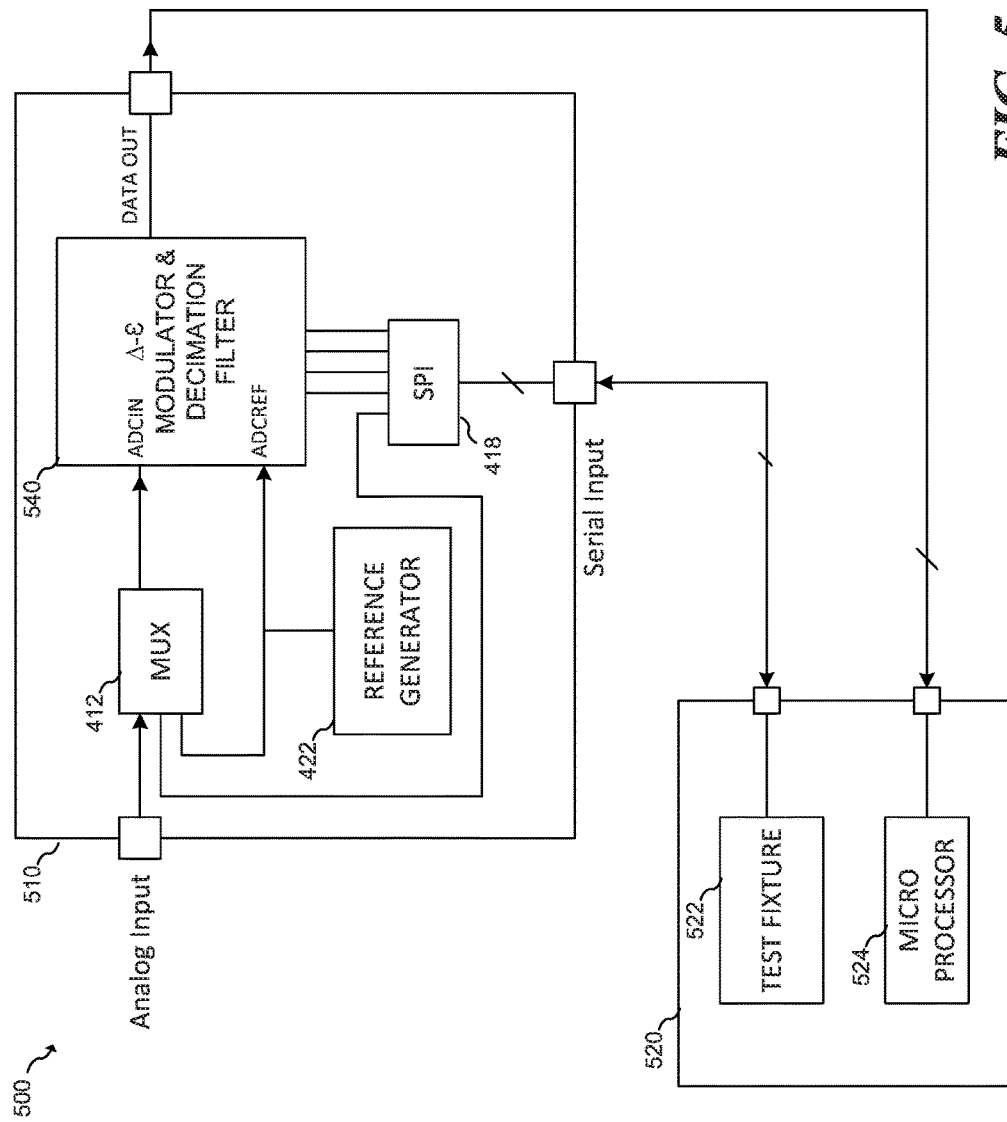
FIG. 5 illustrates an embodiment gain calibration mode set up to measure and calculate a gain calibration coefficient using a test fixture.

FIG. 5 illustrates a block diagram representing a test set up configuration to measure the calibration coefficient during the embodiment calibration mode of the switched-capacitor delta-sigma ADC 510. A test set up unit 520 includes a test fixture 522 capable of communicating with delta-sigma ADC 510 via a serial port interface 418. The test fixture communicates via serial port interface (SPI) 418 to place the ADC 510 in the calibration mode. Alternatively, other types of digital interfaces may be used.

During the calibration mode, SPI 418 controls the mux 412 to select a reference voltage instead of an analog input signal. The mux 412 passes a reference voltage to an input of the delta-sigma modulator and decimation filter 540 during the calibration mode. A data out of the delta-sigma modulator and decimation filter 540 is read back and stored in a memory of a micro-processor 524. The data out is further processed by the micro-controller to calculate a calibration coefficient that may be used to correct the data out during normal mode of operation as described in FIG. 4. The test setup and configuration to calculate and measure a calibration coefficient and storing it in the micro-controller for future use described above is one of many different ways to calculate and store the calibration coefficients that may be used during post-processing of the measured data. In an alternative embodiment, an equivalent DATAOUT may be obtained, if the mux 412 is placed in the reference path, and ADCIN is used as ADCREF during gain calibration. In another embodiment, muxes may be included for both ADCIN and ADCREF.

In an embodiment, the test set configuration may be a part of a built-in self-test (BIST) implementation, where the test fixture and the micro-controller are manufactured in the same integrated circuit as the switched-capacitor delta-sigma ADC. In such embodiment, the calibration mode may be operated via a serial port interface of the integrated circuit.

Figure 6:
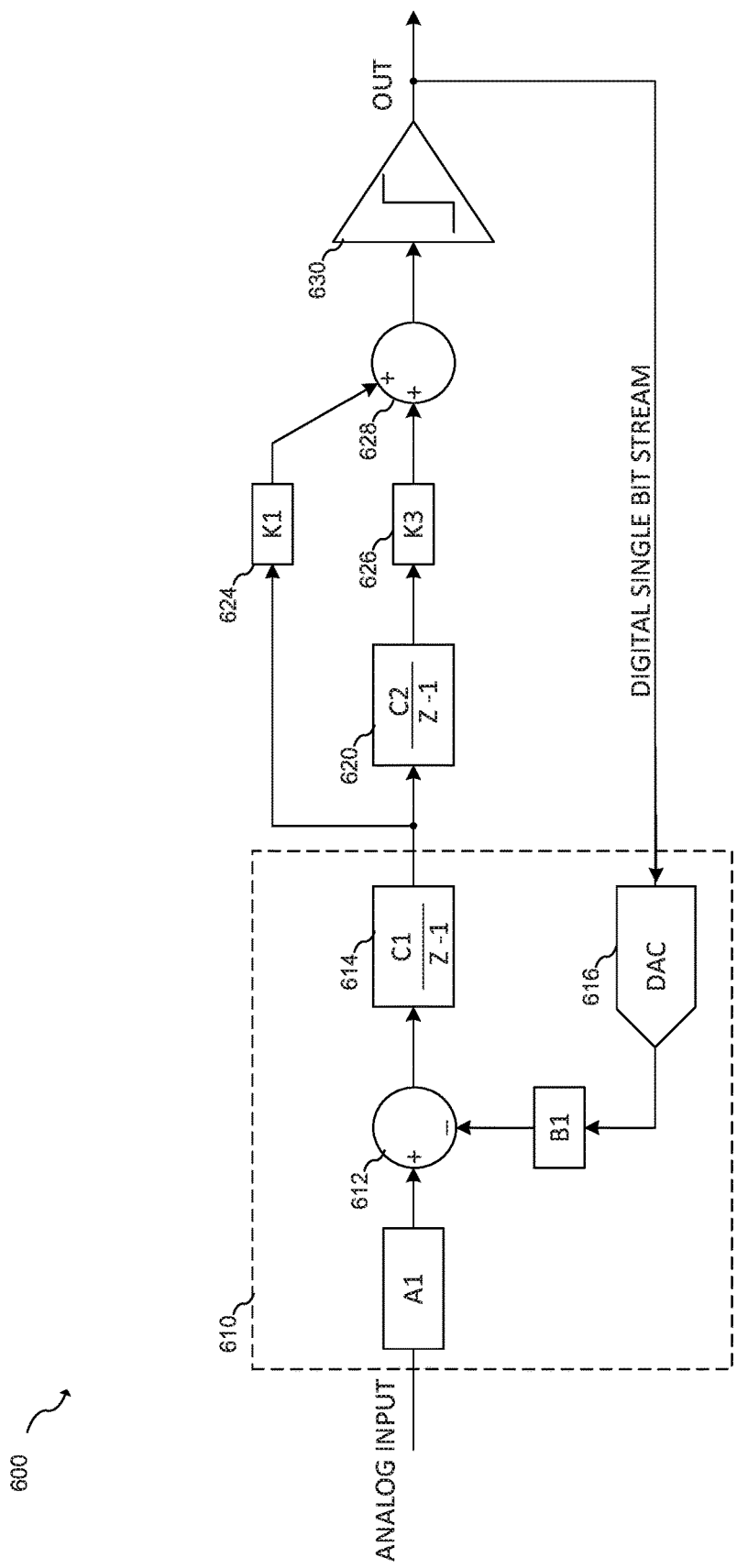
FIG. 6 illustrates a conventional second order feed forward delta-sigma modulator.

FIG. 6 illustrates a block diagram of a conventional second order feed forward delta-sigma modulator 600 that includes a first stage 610, a second integrator 620 and a 1-bit ADC 630. First stage 610 allows integration of a difference voltage between an ADC input A1 and an output B1 of a feedback DAC 616. The difference voltage is generated by summer 612 that uses analog input A1 and the output B1 of feedback DAC 616 as inputs. A first integrator 614 performs the integration with a gain factor C1. First stage 610 may be implemented by FIG. 2A and FIG. 2B.

Second order delta-sigma modulator 600 performs a second integration of the output of first integrator 614 by a second integrator 620. A feed forward path 624 allows the output of first integrator 614 to be scaled by a factor K1 and summed by a summer 628. The purpose of the feed forward is to limit signal swings at the output of the second integrator and also bypass the delay at second integrator 620. Summer 628 sums the feed forward value of first integrator 614 and a scaled output of second integrator 620 and apply the summing value to 1-bit ADC 630 to be converted to a digital stream of output. The feed forward path described here is one of many different ways to implement feed forward technique in a second order delta-sigma modulator. In an embodiment, other paths of feed forward may be used. Alternatively, embodiment circuits and gain calibration method may be applied to other delta-sigma architectures known in the art.

Figure 7:
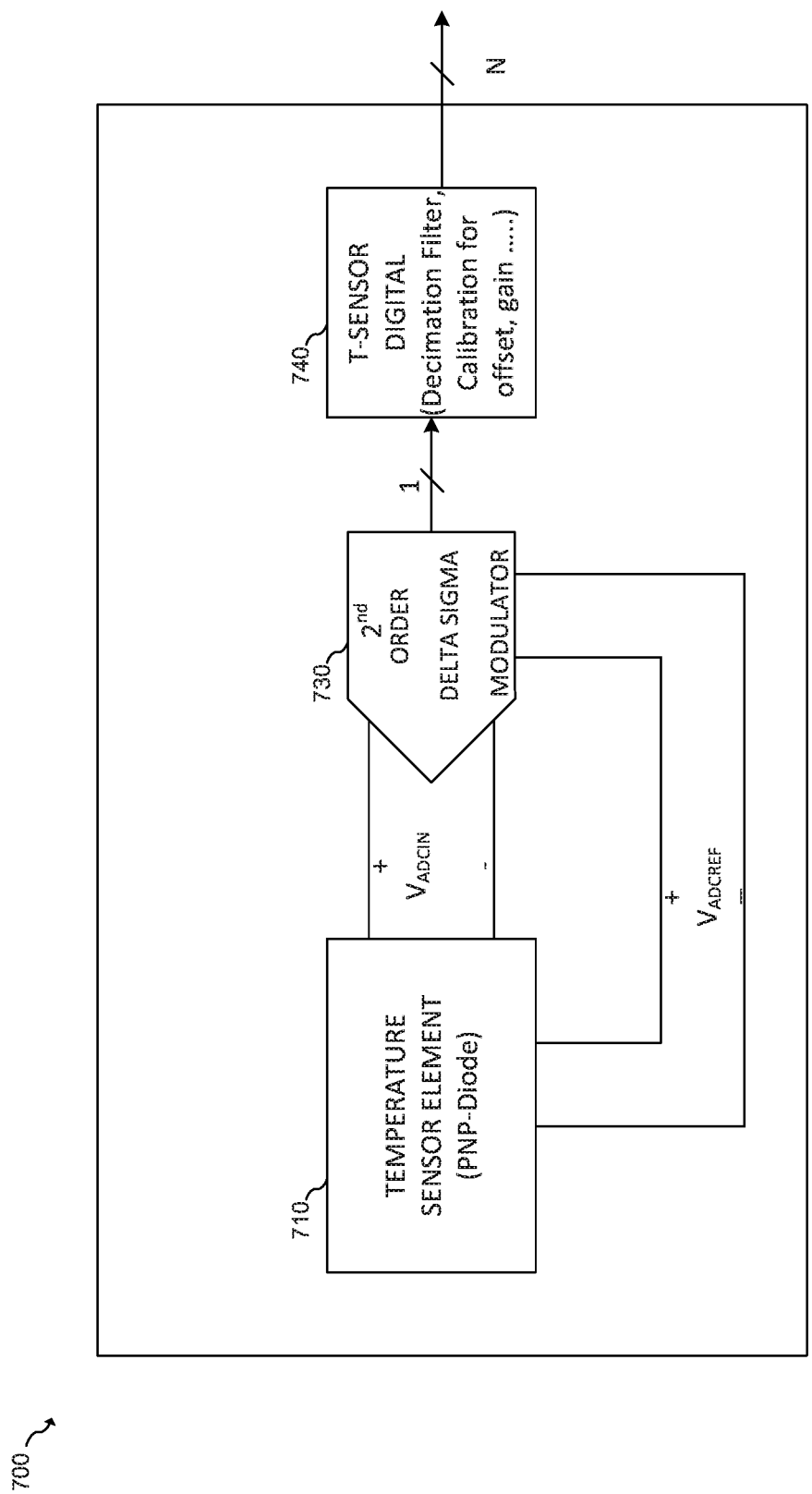
FIG. 7 illustrates a block diagram of a temperature sensing circuit.

FIG. 7 illustrates an embodiment temperature sensor 700 that includes a temperature sensor element 710, coupled to a second order switched-capacitor 1-bit delta-sigma modulator 730. The output of 1-bit delta-sigma modulator 730 is connected to a digital block 740 that includes digital functions, for example, decimation filter, calibration control for offset and gain. According to an embodiment, temperature sensor element 710 generates a reference voltage $V_{ADCREF}$ and a temperature equivalent input voltage used as in input voltage $V_{ADCIN}$. The temperature equivalent voltage used as $V_{ADCIN}$ may be proportional to absolute temperature (PTAT) voltage which is used as an input by the delta-sigma modulator 730. The PTAT voltage generated by temperature sensor element 710 is converted to a high frequency stream of 1-bit digital output that is used by digital block 740. The high frequency stream of 1-bit digital output is a digital representation of the input analog PTAT voltage representing a temperature.

A low pass digital filter inside digital block 740 attenuates quantization noise generated by the delta-sigma modulator at high frequencies. In an embodiment, the digital filter may be implemented by using a weighted average, among other possible methods of implementation. A decimator is used at the output of the digital filter to decrease the output data rate and generate an N-bit code. In another embodiment, the N-bit word at the output of the decimator may be further post processed for gain and/or offset correction to generate a digital code representing the temperature.

Figure 8:
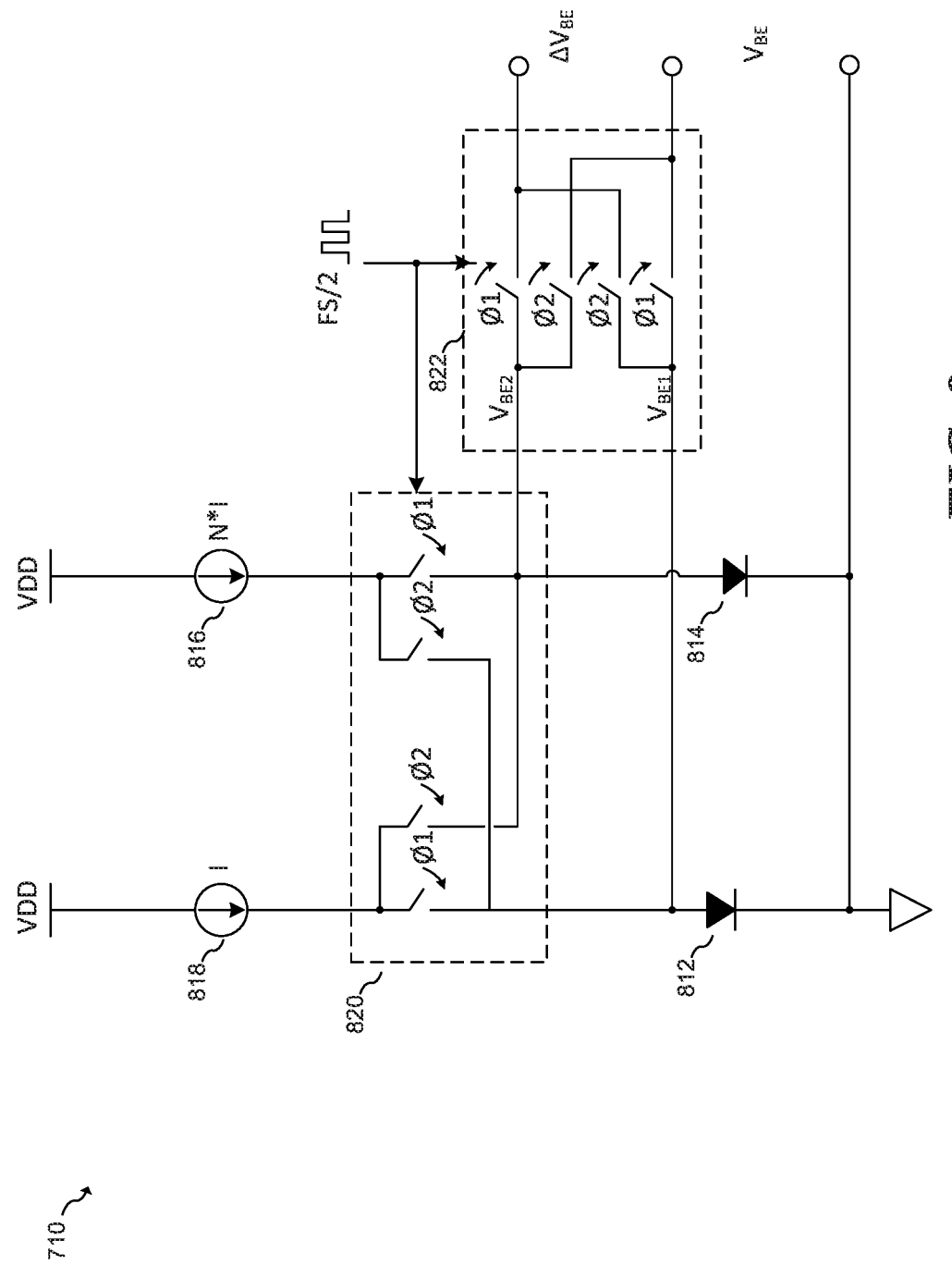
FIG. 8 illustrates a temperature sensor using diode connected devices.

FIG. 8 illustrates a temperature sensing circuit 710 in an embodiment temperature sensor 700. Temperature sensing circuit 710 uses two diodes 812 and 814 to generate a reference voltage $V_{ADCREF}$ that is equal to a sum of a CTAT voltage $V_{BE}$ and a PTAT voltage $\Delta V_{BE}$. The sum of $V_{BE}$ and $\Delta V_{BE}$ is used by an embodiment data converter as a reference voltage. $V_{BE}$ is a base-emitter voltage of a bipolar PNP transistor that is forward biased and operating in an active region. The CTAT voltage (base-emitter voltage) $V_{BE}$ has a negative temperature coefficient and this negative temperature coefficient is typically around −2 mV/° C. The PTAT voltage $\Delta V_{BE}$ is a difference of base-emitter voltages between two bipolar transistors operating with two different bias currents. In some embodiments, the diodes 812 and 814 could be implemented using diode connected bipolar transistors or other diode structures that may be implemented using a bulk CMOS process.

Temperature sensor 710 also includes switching circuits 820 and 822. The switching circuits 820 and 822 include multiple switches that are controlled by a clock with a frequency of $F_S/2$. The sampling frequency $F_S/2$ is synchronized with the clock of the delta-sigma modulator. Switching circuit 820 allows an option of swapping the connections of current sources 816 and 818 to diodes 814 and 812 respectively. The switching circuit 820 allows a dynamically interchanging of current mirrors biasing the diodes 812 and 814 in order to mitigate the effect of mismatch of the diodes.

Switching circuit 820 includes four switches and they are controlled by clock phase ø1 and ø2. A first pair of switches is used to switch current 818 between diodes 812 and 814 based on the clock phase ø1 and ø2. Similarly, a second pair of switches is used to switch current 816 between diodes 812 and 814. In clock phase ø1, current 818 is used to bias diode 812 and current 816 is used to bias diode 814. Alternatively, during clock phase ø2, current 818 is used to bias diode 814 and current 816 is used to bias diode 812. A difference voltage $\Delta V_{BE}$ between forward biased diode 814 and diode 812 is outputted by switching circuit 822. Switching circuit 822 includes a first pair of switches coupled to an anode of diode 814 and a second pair of switches coupled to an anode of diode 812. The switches are controlled by clock phase ø1 and ø2 to output a forward biased diode 814 voltage $V_{BE2}$ at one terminal and forward biased diode $V_{BE1}$ at another terminal. The difference voltage $\Delta V_{BE}$ is equal to ($V_{BE2} - V_{BE1}$).

In the present example of FIG. 8, switching circuit 822 is used to dynamically interchange the connections of the anodes of the diodes 812 and 814 to generate $V_{BE}$ and $\Delta V_{BE}$ so that the voltages $V_{BE1}$ and $V_{BE2}$ are not changing over a clock period and $\Delta V_{BE}$ and $V_{BE}$ can be properly sampled.

The effect of mismatch of the current sources 816 and 818 may also be mitigated by performing a dynamic element matching (DEM) between the current sources (not shown here). By using DEM, the voltages $V_{BE}$ and $\Delta V_{BE}$ are averaged across different devices and errors due to mismatch may be reduced.

In some embodiments, double sampling circuits may be used to improve the ADC noise performance. It is to be noted that switching circuits 820 and 822 can be combined with the sampling switches in the ADC, to optimize the implementation of a double sampling structure by reducing the number of switches used in the signal path.

Figure 9A:
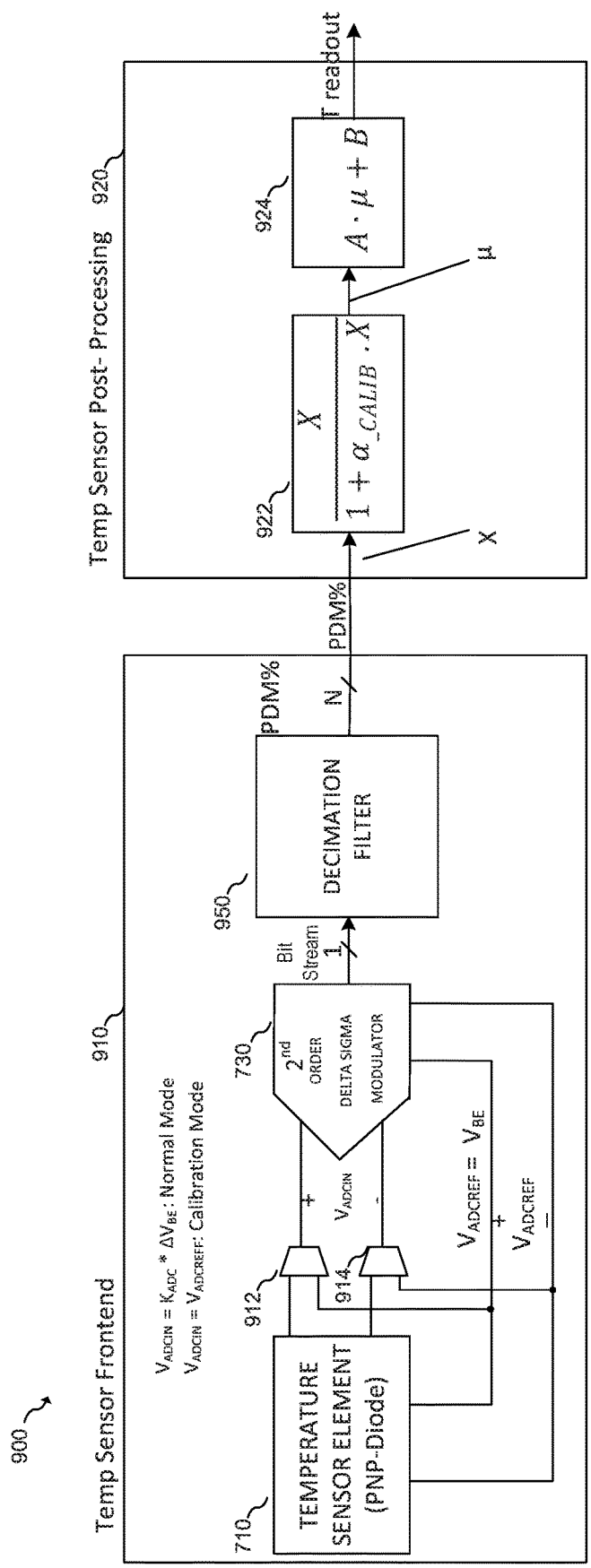
FIG. 9A illustrates an embodiment temperature sensing front end and post-processing circuit using an embodiment gain calibration method and a base-emitter voltage as a reference voltage.

FIG. 9A illustrates an embodiment temperature sensing circuit 900 that includes a temperature sensor front end circuit 910 and a temperature sensor post-processing circuit 920. Temperature sensor front end circuit 910 uses temperature sensor element 710 to generate an ADC reference voltage $V_{ADCREF}$ that is equal to a base-emitter voltage $V_{BE}$ and an ADC input voltage $V_{ADCIN}$ that is a multiple of an ADC gain $K_{ADC}$ and a difference of $V_{BE}$ voltages of two bipolar transistors $\Delta V_{BE}$. Muxes 912 and 914 are used to multiplex input signals to second order delta-sigma modulator 730 based on whether the system is in a gain calibration or a normal operation mode. Second order delta-sigma modulator 730 uses $V_{BE}$ as a reference voltage and $\Delta V_{BE}$ as an input voltage during the normal mode. Alternatively, muxes 912 and 914 provide $V_{BE}$ as the ADC input voltage to the input of the delta-sigma modulator 730 during a calibration mode. Mux 912 and 914 may be placed in the reference path to multiplex $V_{ADCIN}$ as a reference for the ADC. Thus, $\Delta V_{BE}$ is used as both the input voltage and the reference voltage during the calibration mode.

As mentioned before, the output of delta-sigma modulator 730 is a digital bit stream representation of the analog input to delta-sigma modulator 730. The stream of digital output is provided to a decimation filter 950 that generates a pulse density modulation percent (PDM %) in terms of an N bit digital code representing a digital value of the analog ADC input $V_{ADCIN}$. The PDM % may be expressed as a ratio of the ADC input and the ADC reference voltage. In this example, analog ADC input is a difference voltage $\Delta V_{BE}$ of base-emitter voltages of two diodes biased at a different current ratio. The analog ADC input is represented by the equation:

$$V_{ADCIN} = K_{ADC} * \Delta V_{BE} \quad (12)$$

where $K_{ADC}$ is an ADC gain and in the present embodiment, proportional to a ratio of an input sampling capacitor and a reference sampling capacitor in the second order delta-sigma modulator 730. In other embodiments, the difference voltage $\Delta V_{BE}$ may be implemented by two bipolar transistors and biased with different currents.

In an embodiment, ADC reference voltage $V_{BE}$ and ADC input voltage $K_{ADC} * \Delta V_{BE}$ are used to generate a pulse density modulation percent (PDM %). The PDM % represents an input analog sampled signal as a stream of 1-bit data pulses where a density of the pulses represents an analog value. Thus, for the present embodiment, PDM % can be expressed by the equation:

$$PDM\% = X = K_{ADC} \frac{\Delta V_{BE}}{V_{BE}}. \quad (13)$$

A temperature sensor post-processing circuit 920 is used to process the PDM % value to a temperature readout value. Temperature sensor post-processing circuit 920 includes a mapping circuit 922 to map the PDM % into a PTAT ratio value μ. The PTAT ratio μ is further mapped to a digital temperature value by a mapping circuit 924. The digital temperature reading can be obtained by means of a PTAT ratio μ that is expressed as:

$$\mu = X/(1+X) = \alpha^* \Delta V_{BE}/(V_{BE} + \alpha^* \Delta V_{BE}) = \alpha^* \Delta V_{BE}/V_{BG}, \quad (14)$$

where $V_{BG}$ is temperature independent voltage or commonly known as a band-gap voltage, $\Delta V_{BE}$ is a PTAT voltage, and the ADC gain $K_{ADC}$ is proportional to the factor α in the expression. The digital temperature T in Celsius can be then obtained by linear scaling:

$$T = A^* \mu + B, \quad (15)$$

where $A = A0^*(V_{BG}/\alpha)$ and B is Kelvin temperature that is equal to 273.15° C.

According to an embodiment, an accurate temperature measurement can be obtained after performing a calibration algorithm, where the PTAT ratio μ is scaled as:

$$\mu = \frac{X}{1 + X * \alpha\_calib} \quad (16)$$

and coefficient A is expressed as:

$$A = \frac{A0 * V_{BG\_calib}}{\alpha\_calib}, \quad (17)$$

where, $$V_{BG\_calib} = V_{BE} + \alpha^* \Delta V_{BE}. \quad (18)$$

In the present embodiment, $V_{BG\_calib}$ and a calibration coefficient $\alpha\_calib$ can be measured in three steps. The first step includes measuring real $K_{ADC}$ or ADC gain by using the following relationship, $$\alpha\_calib = \alpha/K_{ADCreal}. \quad (19)$$

The first step basically includes measuring a real or actual ADC gain $K_{ADCreal}$ and may use the embodiment gain calibration methods as described above when ADC input $V_{ADCIN}$ and ADC reference $V_{ADCREF}$ are made equal. The second step involves measuring $\Delta V_{BE}$ by using a known $V_{REF\_calib}$ as an ADC reference. The third or the final step includes calculating $V_{BE}$ out of the measurement of the ratio in normal operation $\Delta V_{BE}/V_{BE}$. ($\Delta$VBE assumed to be the same as in the previous step.)

Figure 9B:
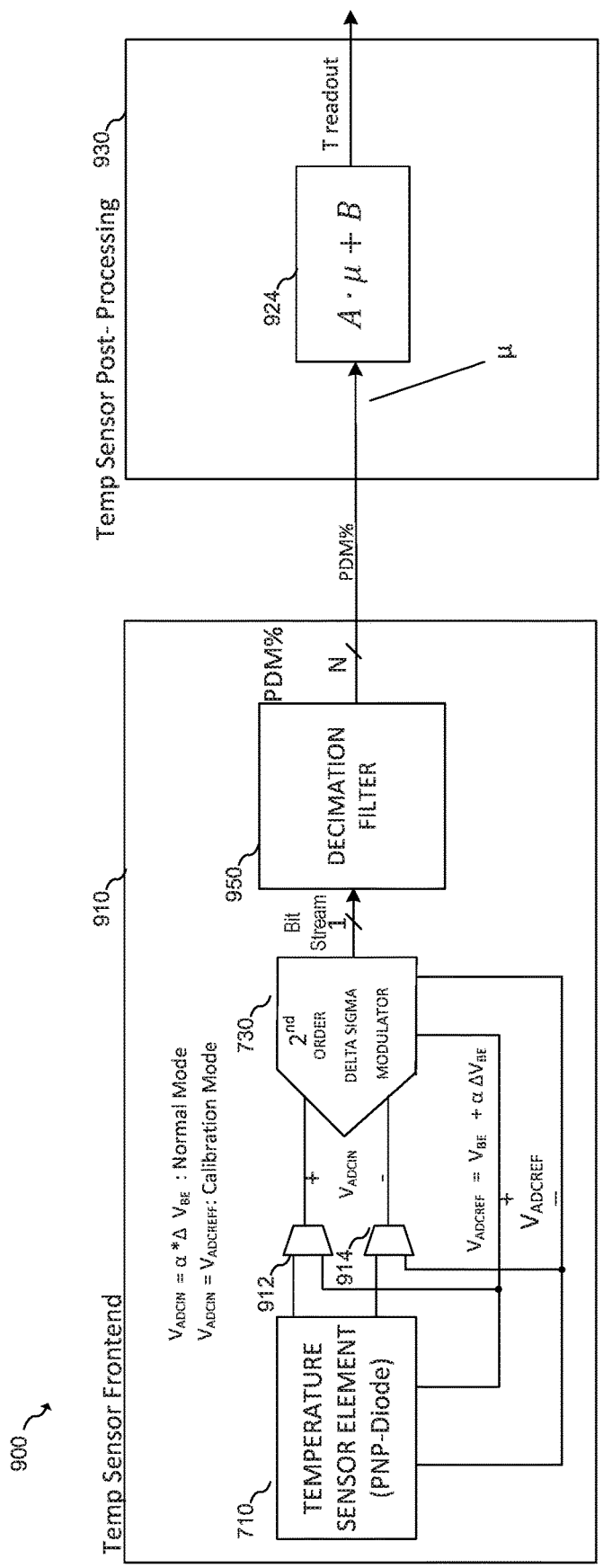
FIG. 9B illustrates an embodiment temperature sensing front end and post-processing circuit using a temperature independent reference voltage.

FIG. 9B illustrates another embodiment temperature sensing circuit 910 where temperature sensing element 710 is configured to generate an input voltage $\Delta V_{BE}$. The amplified version is denoted by $\alpha \Delta V_{BE}$, where a is the gain factor generated in the first stage of the ADC and it is proportional to a ratio of an input sampling capacitor and a reference sampling capacitor in the second order delta-sigma modulator 730. Furthermore, using the first integrator of the ADC configured as in gain calibration mode and having a reference input $V_{ADCREF} = V_{BE}$, and an ADC input $V_{ADCIN} = \Delta V_{BE}$, is equivalent to an ADC having a reference voltage $V_{ADCREF}$:

$$V_{ADCREF} = V_{BE} + \alpha \Delta V_{BE} \quad (20)$$

where α is a gain factor proportional to ADC gain $K_{ADC}$ and given by the equation:

$$\alpha = 2 * \frac{C_{SMP}}{C_{REF}} \quad (21)$$

where $C_{SMP}$ is the capacitance of a sampling capacitor for the ADC input voltage and $C_{REF}$ is the capacitance of a reference sampling capacitor for the ADC reference voltage. In various embodiments, ADC reference voltage $V_{ADCREF}$ described in equation (20) is made temperature-independent by selecting a suitable value for α. The resulting PDM % at the output of the decimation filter 950 is in this case:

$$\text{PDM \%} = \alpha^* \Delta V_{BE}/(V_{BE} + \alpha^* \Delta V_{BE}), \quad (22)$$

which directly produces the PTAT ratio μ described earlier. In the embodiment of FIG. 9B, temperature sensor post-processing circuit 930 does not include scaling circuit 922. In this case, the digital post processing related to the calculation of the PTAT ratio μ is not necessary. The scaling circuit 924 provides the temperature readout value based on linear scaling of PTAT ratio μ.

In an embodiment, the gain factor α can be calculated by measuring a real ADC gain $K_{ADCreal}$ using embodiment gain calibration methods described above. The real ADC gain includes errors due to mismatches and other non-idealities of components used in the ADC which are nominally identical. As such, gain factor α can be calibrated by using the real ADC gain and accurate temperature measurements can be made based on post processing the PDM % by the temperature sensor post-processing circuit.

Thus, an accurate digital value of the temperature can be obtained by using the PDM % during post-processing. This post processing involves converting the PDM % or the N-bit code to a digital value that represents a digital value of the temperature. The PDM % may also be represented by a proportional to absolute temperature (PTAT) ratio μ given by the equation:

$$\text{PTAT ratio} = \mu = \alpha \frac{\Delta V_{BE}}{V_{BE} + \alpha \Delta V_{BE}} \quad (23)$$

where the term $\alpha \Delta V_{BE}$ in the numerator represents a PTAT voltage and the term $(V_{BE} + \alpha \Delta V_{BE})$ in the denominator represents a temperature independent reference voltage or in some cases a band-gap voltage. In an embodiment, the gain factor α can be chosen a value that makes the denominator a temperature independent reference voltage that is often known as a band-gap voltage. In various embodiments, the gain factor α can be calculated in a calibration mode and the calculated gain factor $\alpha\_calib$ may be used during post-processing to achieve a digital temperature measurement that is free from systematic errors related to matching and non-idealities of various components used in the second order delta-sigma modulator 730.

Figure 10:
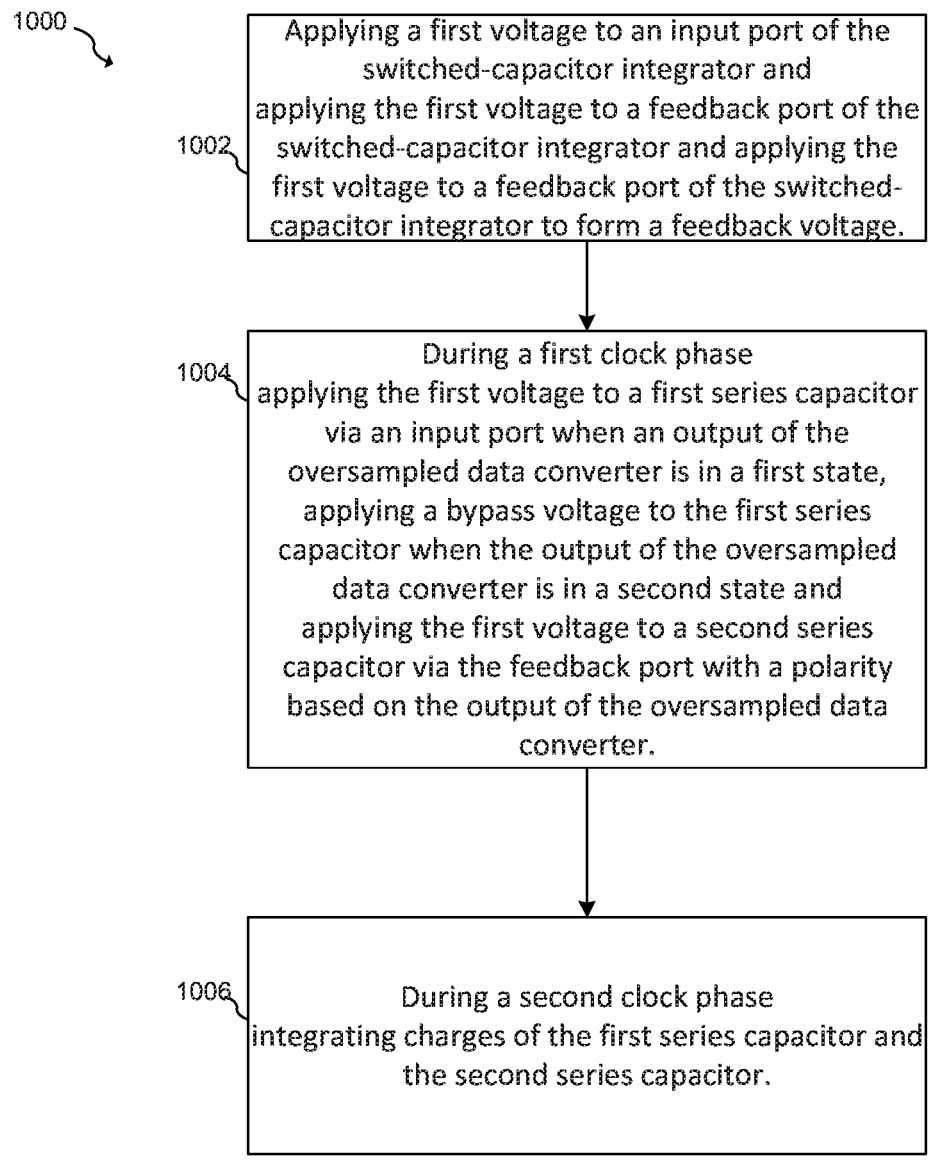
FIG. 10 illustrates a flow diagram of an embodiment ADC gain calibration method.

FIG. 10 illustrates a flowchart of a method 1000 for an embodiment gain calibration method of an oversampled data converter. The method 1000 begins at step 1002 that includes applying a first voltage to an input port of the switched-capacitor integrator and applying the first voltage to a feedback port of the switched-capacitor integrator. Step 1002 further includes applying the first voltage to form a feedback voltage. Step 1004 starts during a first clock phase and includes applying the first voltage to a first series capacitor when an output of the oversampled data converter is in a first state. Step 1004 also includes applying a bypass voltage to the first series capacitor when the output of the oversampled data converter is in a second state and applying the first voltage to a second series capacitor via the feedback port with a polarity based on the output of the oversampled data converter. In step 1006, which includes a second clock phase, integration of charges across the first series capacitor and second series capacitor takes place.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method of operating an oversampled data converter having a switched-capacitor (SC) integrator, the method including: operating the oversampled data converter in a gain calibration mode including applying a first voltage to an input port of the switched-capacitor integrator; applying the first voltage to a feedback port of the switched-capacitor integrator to form a feedback voltage; during a first clock phase applying the first voltage to a first series capacitor via the input port when an output of the oversampled data converter is in a first state, applying a bypass voltage to the first series capacitor when the output of the oversampled data converter is in a second state and applying the first voltage to a second series capacitor via the feedback port with a polarity based on the output of the oversampled data converter; and during a second clock phase integrating charges of the first series capacitor and the second series capacitor. The method further includes operating the oversampled data converter in a normal operation mode, operating including adjusting the output of the oversampled data converter according to a calibration coefficient, where the calibration coefficient is based on the output of the oversampled data converter during the gain calibration mode. Other embodiments of this aspect include corresponding circuits and systems and methods configured to implement the various elements.

Implementations may include one or more of the following features. The method may also include storing the calibration coefficient prior to operating the oversampled data converter in the normal operation mode. The other implementations of the embodiments include the method of operating the oversampled data converter where the calibration coefficient is a function of a gain value $K_{ADCreal}$ of the oversampled data converter, where $$K_{ADCreal} = 2\frac{V_{ADCOUT}}{1 - V_{ADCOUT}}$$

and $V_{ADCOUT}$ is the output of the oversampled data converter. Implementations of the described techniques may include hardware, a method or process, or computer software on a computer-accessible medium.

In some embodiments, the first series capacitor includes plurality of first capacitors, and the first voltage includes a differential voltage. In another embodiment, the method further including: operating the oversampling data converter in a normal operation mode including: applying an input voltage to the input port of the switched-capacitor integrator, during the first clock phase applying a bypass voltage to the first series capacitor, and applying the feedback voltage to the second series capacitor via the feedback port with a polarity based on the output of the oversampled data converter; and during the second clock phase integrating charges of the first series capacitor and the second series capacitor. The method further including: applying the bypass voltage that includes: disconnecting the input port from the first series capacitor; and applying a ground voltage to the first series capacitor. Other embodiments of this aspect include corresponding circuits and systems configured to perform various actions of the methods.

A further general aspect includes an oversampled data converter having: a switched-capacitor integrator including an amplifier; a first series capacitor coupled between an input port and the amplifier, a first switching network coupled to the first series capacitor, a second series capacitor coupled between a feedback port and the amplifier, and a second switching network coupled to the second series capacitor; a controller coupled to the first switching network and the second switching network, the controller configured to operate the oversampled data converter in a gain calibration mode including during a first clock phase apply a first voltage to the first series capacitor via the input port and the first switching network when an output of the oversampled data converter in a first state, and apply a bypass voltage to the first series capacitor when the output of the oversampled data converter is in a second state, and apply the first voltage to a second series capacitor via the feedback port and the second switching network with a polarity based on the output of the oversampled data converter; and during a second clock phase, configure the switched-capacitor integrator to integrate charges of the first series capacitor and the second series capacitor. Other embodiments of this aspect include corresponding circuits and systems configured to perform various actions of the methods.

The oversampled data converter further includes a gain correction circuit coupled to the output of the oversampled data converter, where the gain correction circuit is configured to adjust the output of the oversampled data converter according to a calibration coefficient, where the calibration coefficient is based on the output of the oversampled data converter during the gain calibration mode. In some embodiments, the oversampled data converter may also include the calibration coefficient that is a function of a gain value $K_{ADCreal}$ of the oversampled data converter, where $$K_{ADCreal} = 2\frac{V_{ADCOUT}}{1 - V_{ADCOUT}},$$

and $V_{ADCOUT}$ is the output of the oversampled data converter. Other embodiments of this aspect include corresponding circuits and systems configured to perform various actions of the methods.

In some embodiments, the oversampled data converter further includes: a test measurement unit coupled to the oversampled data converter, where the test measurement unit is configured to program the oversampled data converter in the gain calibration mode; and a micro-controller configured to read back an output of the oversampled data converter during the gain calibration mode and calculate the calibration coefficient based on the output of the oversampled data converter. In another embodiment, the micro-controller may be further configured to store the calibration coefficient in a retrievable memory circuit. Implementations of the described techniques may include hardware, a method or process, or computer software on a computer-accessible medium.

Implementations may also include the test measurement unit and the micro-controller being integrated on a same silicon substrate. In some embodiments, the oversampled data converter may also include the first series capacitor having a plurality of first capacitors and the second series capacitor having a plurality of second capacitors. The oversampled data converter may also include the input ports having a differential input port and the feedback port including a differential feedback port. Other embodiments of this aspect include corresponding circuits and systems configured to perform various actions of the methods.

One general aspect includes a temperature sensor circuit including: a delta-sigma modulator having a first input and a reference input; a temperature sensor element configured to generate a first voltage and first reference voltage based on a measured temperature; and a first mux and a second mux coupled between the temperature sensor element and the delta-sigma modulator, where the first mux and the second mux are configured to output the first reference voltage during a first mode and the first voltage during a second mode. The temperature sensor circuit further including a decimation filter having an input coupled to an output of the delta-sigma modulator and an output configured to generate a pulse density modulation percent (PDM %) represented by an N-bit code. The temperature sensor circuit may also include a temperature sensor element implemented by a PTAT circuit. Other embodiments of this aspect include corresponding circuits and systems configured to perform various actions of the methods.

In some embodiments, the temperature sensor circuit may also include the first voltage as an output of the PTAT circuit. In other embodiments, the temperature sensor circuit may also include the first reference voltage having a CTAT voltage. In further embodiments, the temperature sensor circuit may also include the first reference voltage of the temperature sensor element having a bandgap voltage. Implementations of the described techniques may include hardware, a method or process, or computer software on a computer-accessible medium.

Implementation may also include the temperature sensor circuit having the delta-sigma modulator using a base emitter voltage of a forward biased bipolar transistor as the first input and the reference input during the first mode. Another implementation may include the temperature sensor circuit where a calibration coefficient is measured based on a PDM % during the first mode, where the calibration coefficient is used to adjust a temperature measurement during the second mode. In another embodiment, the temperature sensor circuit may have the first mode as a calibration mode and the second mode as a normal mode of operation. Other embodiments of this aspect include corresponding circuits and systems configured to perform various actions of the methods.

Embodiments of the present invention may be applied to different temperature sensing circuits where a very high accuracy of measurement is needed. In another embodiment, a two point gain measurement using two different reference voltages can be replaced with a single ADC reference voltage $V_{ADCREF}$ to measure an accurate ADC gain. The gain calibration method described here can be used in a number of applications.

According to an embodiment, a switched-capacitor delta-sigma modulator ADC is configured to provide an accurate ADC gain $K_{ADC}$ measurement during a calibration mode without exceeding the ADC full scale output value while using ADC reference $V_{ADCREF}$ as an ADC input voltage $V_{ADCIN}$. Alternatively, ADC input voltage $V_{ADCIN}$ may be used as ADC reference voltage $V_{ADCREF}$. According to another embodiment, additional switches may be added in the sampling path of the ADC input $V_{ADCIN}$ during a calibration mode. The additional switches are used during gain calibration mode and remain open during normal operation mode. Therefore, the additional switches do not interfere with normal function of the switched-capacitor delta-sigma modulator.

In one example, a smart temperature sensor includes an embodiment ADC gain calibration method to measure temperature with an accuracy level between 0.05% to 0.1%. An advantage of the present embodiments includes measurement of the ADC gain without saturating the ADC to a full scale value. Some embodiments may include measuring an actual ADC gain that includes the actual mismatches and non-idealities of nominally identical devices due to statistical variations in semiconductor processing. In other embodiments, measuring of the actual ADC gain includes mismatches of various components due to parasitic devices associated with a placement of these components in the layout and effects of nearby devices in the layout.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating an oversampled data converter having a switched-capacitor integrator, the method comprising:
   operating the oversampled data converter in a gain calibration mode comprising
      applying a first voltage to an input port of the switched-capacitor integrator;
      applying the first voltage to a feedback port of the switched-capacitor integrator to form a feedback voltage;
      during a first clock phase
         applying the first voltage to a first series capacitor via the input port when an output of the oversampled data converter is in a first state,
         applying a bypass voltage to the first series capacitor when the output of the oversampled data converter is in a second state and
         applying the first voltage to a second series capacitor via the feedback port with a polarity based on the output of the oversampled data converter; and
      during a second clock phase
         integrating charges of the first series capacitor and the second series capacitor.

2. The method of claim 1, further comprising operating the oversampled data converter in a normal operation mode, operating comprising adjusting the output of the oversampled data converter according to a calibration coefficient, wherein the calibration coefficient is based on the output of the oversampled data converter during the gain calibration mode.

3. The method of claim 2, further comprising storing the calibration coefficient prior to operating the oversampled data converter in the normal operation mode.

4. The method of claim 2, wherein the calibration coefficient is a function of a gain value $K_{ADCreal}$ of the oversampled data converter, where $$K_{ADCreal} = 2\frac{V_{ADCOUT}}{1 - V_{ADCOUT}},$$

and
$V_{ADCOUT}$ is the output of the oversampled data converter.

5. The method of claim 1, wherein the first series capacitor comprises plurality of first capacitors, and the first voltage comprises a differential voltage.

6. The method of claim 1, further comprising:
operating the oversampling data converter in a normal operation mode comprising
applying an input voltage to the input port of the switched-capacitor integrator,
during the first clock phase
apply a bypass voltage to the first series capacitor, and
apply the feedback voltage to the second series capacitor via the feedback port with a polarity based on the output of the oversampled data converter; and
during the second clock phase
integrating charges of the first series capacitor and the second series capacitor.

7. The method of claim 1, wherein applying the bypass voltage comprises:
disconnecting the input port from the first series capacitor; and
applying a ground voltage to the first series capacitor.

8. An oversampled data converter comprising:
a switched-capacitor integrator comprising
an amplifier;
a first series capacitor coupled between an input port and the amplifier,
a first switching network coupled to the first series capacitor,
a second series capacitor coupled between a feedback port and the amplifier, and
a second switching network coupled to the second series capacitor;
a controller coupled to the first switching network and the second switching network, the controller configured to operate the oversampled data converter in a gain calibration mode comprising
during a first clock phase
apply a first voltage to the first series capacitor via the input port and the first switching network when an output of the oversampled data converter in a first state, and
apply a bypass voltage to the first series capacitor when the output of the oversampled data converter is in a second state, and
apply the first voltage to a second series capacitor via the feedback port and the second switching network with a polarity based on the output of the oversampled data converter; and
during a second clock phase, configure the switched-capacitor integrator to integrate charges of the first series capacitor and the second series capacitor.

9. The oversampled data converter of claim 8, further comprising a gain correction circuit coupled to the output of the oversampled data converter, the gain correction circuit configured to adjust the output of the oversampled data converter according to a calibration coefficient, wherein the calibration coefficient is based on the output of the oversampled data converter during the gain calibration mode.

10. The oversampled data converter of claim 9, wherein the calibration coefficient is a function of a gain value $K_{ADCreal}$ of the oversampled data converter, where $$K_{ADCreal} = 2\frac{V_{ADCOUT}}{1 - V_{ADCOUT}},$$

and $V_{ADCOUT}$ is the output of the oversampled data converter.

11. The oversampled data converter of claim 9, further comprising:
a test measurement unit coupled to the oversampled data converter, wherein the test measurement unit is configured to program the oversampled data converter in the gain calibration mode; and
a micro-controller configured to read back an output of the oversampled data converter during the gain calibration mode and calculate the calibration coefficient based on the output of the oversampled data converter.

12. The oversampled data converter of claim 11, wherein the micro-controller is further configured to store the calibration coefficient in a retrievable memory circuit.

13. The oversampled data converter of claim 11, wherein the oversampled data converter, the test measurement unit, and the micro-controller are integrated on a same silicon substrate.

14. The oversampled data converter of claim 8, wherein the first series capacitor comprises a plurality of first capacitors and the second series capacitor comprises a plurality of second capacitors.

15. The oversampled data converter of claim 14, wherein the input port comprises a differential input port and the feedback port comprises a differential feedback port.

16. A temperature sensor circuit comprising:
a delta-sigma modulator having a first input and a reference input;
a temperature sensor element configured to generate a first voltage at a first voltage output and first reference voltage at a first reference voltage output based on a measured temperature, wherein the first reference voltage output is coupled to the reference input of the delta-sigma modulator; and
a signal selection circuit coupled between the temperature sensor element and the delta-sigma modulator, wherein the signal selection circuit is configured to route the first reference voltage to the first input during a first mode and route the first voltage to the first input during a second mode, wherein in the first mode, the first reference voltage is applied to both the first input and the reference input, and in the second mode, the first voltage is applied to the first input and the first reference voltage is applied to the reference input.

17. The temperature sensor circuit of claim 16, further comprising a decimation filter having an input coupled to an output of the delta-sigma modulator and an output configured to generate a pulse density modulation percent (PDM %) represented by an N-bit code.

18. The temperature sensor circuit of claim 16, wherein the temperature sensor element comprises a PTAT circuit.

19. The temperature sensor circuit of claim 18, wherein the first voltage is an output of the PTAT circuit.

20. The temperature sensor circuit of claim 16, wherein the first reference voltage is a CTAT voltage.

21. The temperature sensor circuit of claim 16, wherein the first reference voltage of the temperature sensor element is a bandgap voltage.

22. The temperature sensor circuit of claim 16, wherein the delta-sigma modulator uses a base emitter voltage of a forward biased bipolar transistor as the first input and the reference input during the first mode.

23. The temperature sensor circuit of claim 16, wherein a calibration coefficient is measured based on a PDM % during the first mode, wherein the calibration coefficient is used to adjust a temperature measurement during the second mode.

24. The temperature sensor circuit of claim 16, wherein the first mode is a calibration mode and the second mode is a normal mode of operation.

25. The temperature sensor circuit of claim 16, wherein:
in the first mode, an output signal of the delta-sigma modulator is proportional to:

$$K_{ADC} * \frac{V_{ADCIN}}{K_{ADC} * V_{ADCIN} + V_{ADCREF}},$$

where $K_{ADC}$ is a gain of the delta-sigma modulator, $V_{ADCIN}$ is a voltage at the first input of the delta-sigma modulator, and $V_{ADCREF}$ is a voltage at the reference input of the delta-sigma modulator; and
the second mode, the output signal of the delta-sigma modulator is proportional to:

$$K_{ADC} \frac{V_{ADCIN}}{V_{ADCREF}}.$$

26. The temperature sensor circuit of claim 25, wherein the output signal of the delta-sigma modulator is a pulse density.

* * * * *